US009793302B1

United States Patent
Chen

(10) Patent No.: US 9,793,302 B1
(45) Date of Patent: Oct. 17, 2017

(54) ACTIVE DEVICE

(71) Applicant: AU OPTRONICS CORPORATION, Hsin-chu (TW)

(72) Inventor: Pei-Ming Chen, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/388,717

(22) Filed: Dec. 22, 2016

(30) Foreign Application Priority Data

Apr. 15, 2016 (TW) .............................. 105111946 A

(51) Int. Cl.
H01L 29/10 (2006.01)
H01L 27/12 (2006.01)
H01L 29/786 (2006.01)

(52) U.S. Cl.
CPC ...... H01L 27/1251 (2013.01); H01L 27/1225 (2013.01); H01L 29/7869 (2013.01); H01L 29/78675 (2013.01); H01L 29/78696 (2013.01)

(58) Field of Classification Search
CPC ............. H01L 27/1225; H01L 27/1251; H01L 29/7869; H01L 29/78696; H01L 29/78675
USPC ..................................... 257/43; 438/149–167
See application file for complete search history.

(56) References Cited

U.S. PATENT DOCUMENTS

| 8,759,832 | B2 | 6/2014 | Yang et al. | |
| 2014/0191228 | A1* | 7/2014 | Jung | H01L 29/7869 257/43 |
| 2014/0239290 | A1* | 8/2014 | Kim | H01L 29/7869 257/43 |
| 2014/0353605 | A1 | 12/2014 | Kim et al. | |
| 2016/0172503 | A1* | 6/2016 | Hiramatsu | H01L 29/7869 438/104 |

FOREIGN PATENT DOCUMENTS

TW 201445709 A 12/2014

OTHER PUBLICATIONS

Office Action issued by (TIPO) Intellectual Property Office, Ministry of Economic Affairs, R.O.C. dated Oct. 12, 2016 for Application No. 105111946, Taiwan.

* cited by examiner

Primary Examiner — Brook Kebede
(74) Attorney, Agent, or Firm — Tim Tingkang Xia, Esq.; Locke Lord LLP

(57) ABSTRACT

An active device includes a poly-silicon semiconductor layer, a first insulating layer, a gate electrode, a second insulating layer, a first through hole, an oxide semiconductor layer, a first electrode and a second electrode. The poly-silicon semiconductor layer includes a first doped region, a channel region and a second doped region. The gate electrode is disposed on the first insulating layer covering the poly-silicon semiconductor layer, and corresponds to the channel region. The gate electrode is covered by the second insulating layer, where the first and second insulating layers have a first through hole. The oxide semiconductor layer is disposed on the second insulating layer and corresponds to the gate electrode. The first and second electrodes are oppositely disposed on the oxide semiconductor layer. The oxide semiconductor layer is electrically connected to the second electrode, and to the second doped region via the first through hole.

16 Claims, 25 Drawing Sheets

ACTIVE DEVICE

CROSS-REFERENCE TO RELATED PATENT APPLICATION

This application claims the benefit of priority to Taiwan Patent Application No. 105111946, filed Apr. 15, 2016. The entire content of the above identified application is incorporated herein by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present invention relates to an active device, and in particular, to an active device for increasing an aperture ratio and achieving a narrow frame.

BACKGROUND

Currently, a display panel is generally provided with a single type of active device, and the active device is, for example, a poly-silicon semiconductor active device, an amorphous silicon semiconductor active device, or an oxide semiconductor active device. Generally, each type of active device respectively has advantages and disadvantages when being applied to a display panel. However, due to restrictions of requirements on high resolution and high aperture ratio of a display panel, how to design various types of active devices in the display panel without affecting an aperture ratio of the panel is an urgent problem to be currently resolved.

SUMMARY

According to at least one of the embodiments of the present invention, an active device uses vertically stacked circuit design, together with a process, so as to achieve an objective of saving space, and further increase an aperture ratio and achieve an effect of a narrow frame.

According to at least one of the embodiments of the present invention, an active device is suitable to be disposed on a substrate. The active device includes a poly-silicon semiconductor layer, a first insulating layer, a gate electrode, a second insulating layer, a first through hole, an oxide semiconductor layer, a first electrode, and a second electrode. The poly-silicon semiconductor layer is disposed on the substrate, and has a first doped region, a channel region, and a second doped region. The channel region is located between the first doped region and the second doped region. The first insulating layer covers the poly-silicon semiconductor layer and the substrate. The gate electrode is disposed on the first insulating layer and corresponding to the channel region. The second insulating layer covers the gate electrode and the first insulating layer, where the first insulating layer and the second insulating layer have a first through hole. The oxide semiconductor layer is disposed on the second insulating layer and corresponding to the gate electrode. The first electrode and the second electrode are oppositely disposed on the oxide semiconductor layer respectively. The oxide semiconductor layer is electrically connected to the second electrode, and is electrically connected to the second doped region via the first through hole.

According to at least one of the embodiments of the present invention, an active device is suitable to be disposed on a substrate. The active device includes a first poly-silicon semiconductor layer, a second poly-silicon semiconductor layer, a first insulating layer, a first gate electrode, a second gate electrode, a second insulating layer, a first through hole, a second through hole, a first oxide semiconductor layer, a second oxide semiconductor layer, a first electrode, and a second electrode. The first poly-silicon semiconductor layer and the second poly-silicon semiconductor layer are disposed on the substrate, where the first poly-silicon semiconductor layer has a first doped region, a first channel region, and a second doped region; the second poly-silicon semiconductor layer has a third doped region, a second channel region, and a fourth doped region; the first channel region is located between the first doped region and the second doped region; and the second channel region is located between the third doped region and the fourth doped region. The first insulating layer covers the first poly-silicon semiconductor layer, the second poly-silicon semiconductor layer, and the substrate. The first gate electrode and the second gate electrode are disposed on the first insulating layer and respectively corresponding to the first channel region and the second channel region. The second insulating layer covers the first gate electrode, the second gate electrode, and the first insulating layer, where the second insulating layer has a first through hole and a second through hole, and the first through hole and the second through hole are disposed respectively corresponding to the first gate electrode and the second gate electrode. The first oxide semiconductor layer and the second oxide semiconductor layer are disposed on the second insulating layer and respectively corresponding to the first gate electrode and the second gate electrode. The first electrode and the second electrode are oppositely disposed on the first oxide semiconductor layer and the second oxide semiconductor layer respectively; the first electrode is electrically connected to the first doped region, the third doped region, the second gate electrode, the first oxide semiconductor layer, and the second oxide semiconductor layer; the second electrode is electrically connected to the second doped region, the fourth doped region, the first gate electrode, the first oxide semiconductor layer, and the second oxide semiconductor layer; the first electrode includes a first electrode portion, a second electrode portion, a first connection portion, and a second connection portion; and the second electrode portion includes a third electrode portion, a fourth electrode portion, a third connection portion, and a fourth connection portion.

According to at least one of the embodiments of the present invention, an active device is suitable to be disposed on a substrate. The active device includes a poly-silicon semiconductor layer has a first doped region, a channel region, and a second doped region; a gate electrode disposed over the poly-silicon semiconductor layer; an oxide semiconductor layer; and a first electrode and a second electrode, disposed on the oxide semiconductor layer, wherein the oxide semiconductor layer is electrically connected to the second electrode, and wherein the second electrode is electrically connected to the second doped region via a first through hole, wherein the poly-silicon semiconductor layer, the gate electrode and the oxide semiconductor layer are overlapped along a vertical projection direction.

On the basis of the above, in the active device according to at least one of the embodiments of the present invention, a poly-silicon semiconductor layer and an oxide semiconductor layer are simultaneously disposed on a vertical projection direction, and the two types of semiconductor layers share a gate electrode, so as to improve space utilization of the active device. When the active device according to at least one of the embodiments of the present invention is disposed in a display region of a display panel, an aperture ratio is increased, and an effect of a narrow frame may be further achieved. Besides, the active device according to at least one of the embodiments of the present invention has advantages of poly-silicon semiconductor active device as well as advantages of oxide semiconductor active device, and has relatively high electron mobility as well as relatively preferred low leakage current and critical voltage.

In order to make the foregoing features and advantages of the present invention more comprehensible, embodiments accompanied with figures are described in detail below.

DETAILED DESCRIPTION

Figure 1A:
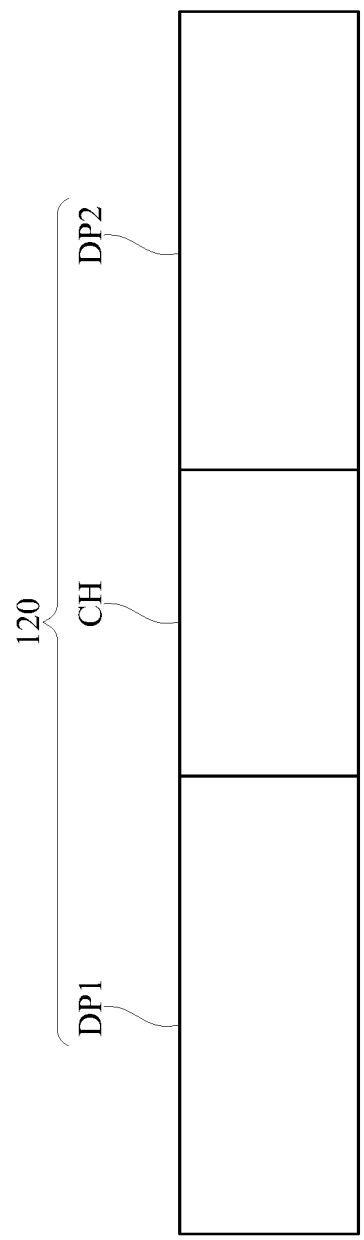
FIG. 1A to FIG. 1G are top views of a manufacturing process of an active device according to an embodiment of the present invention.
Figure 1B:
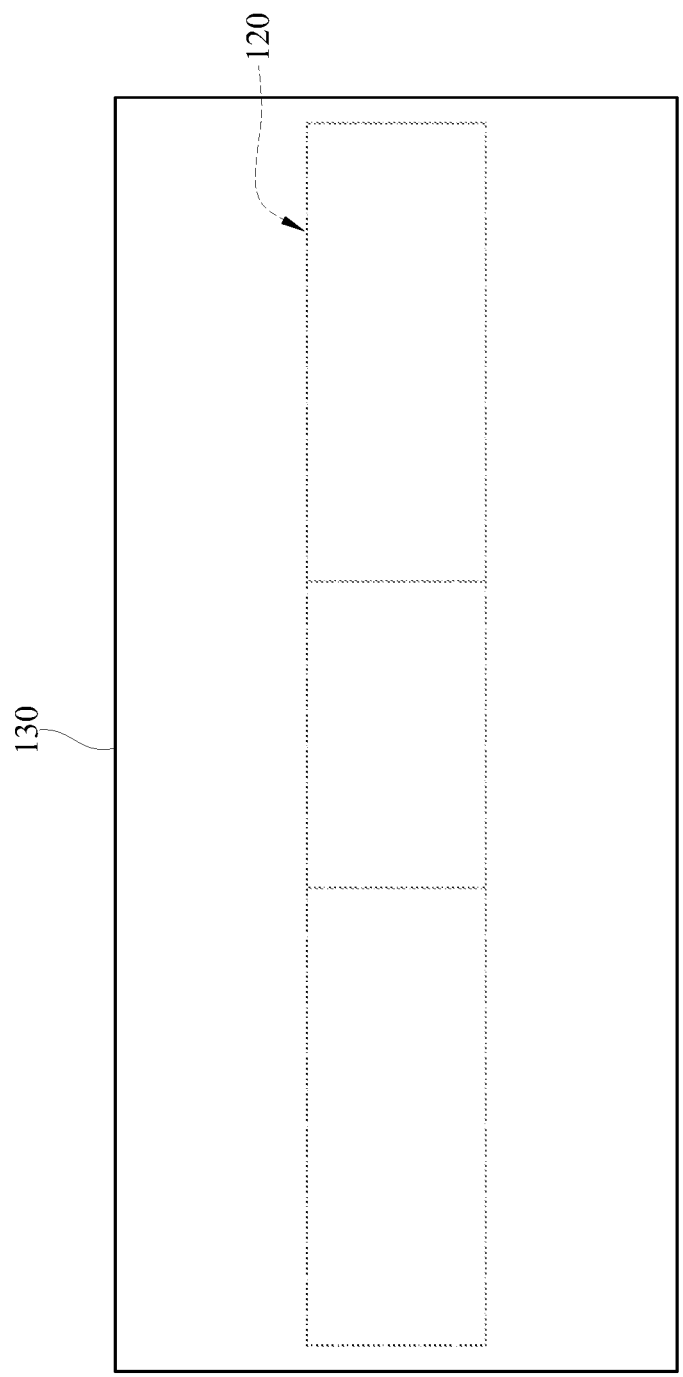
Figure 1C:
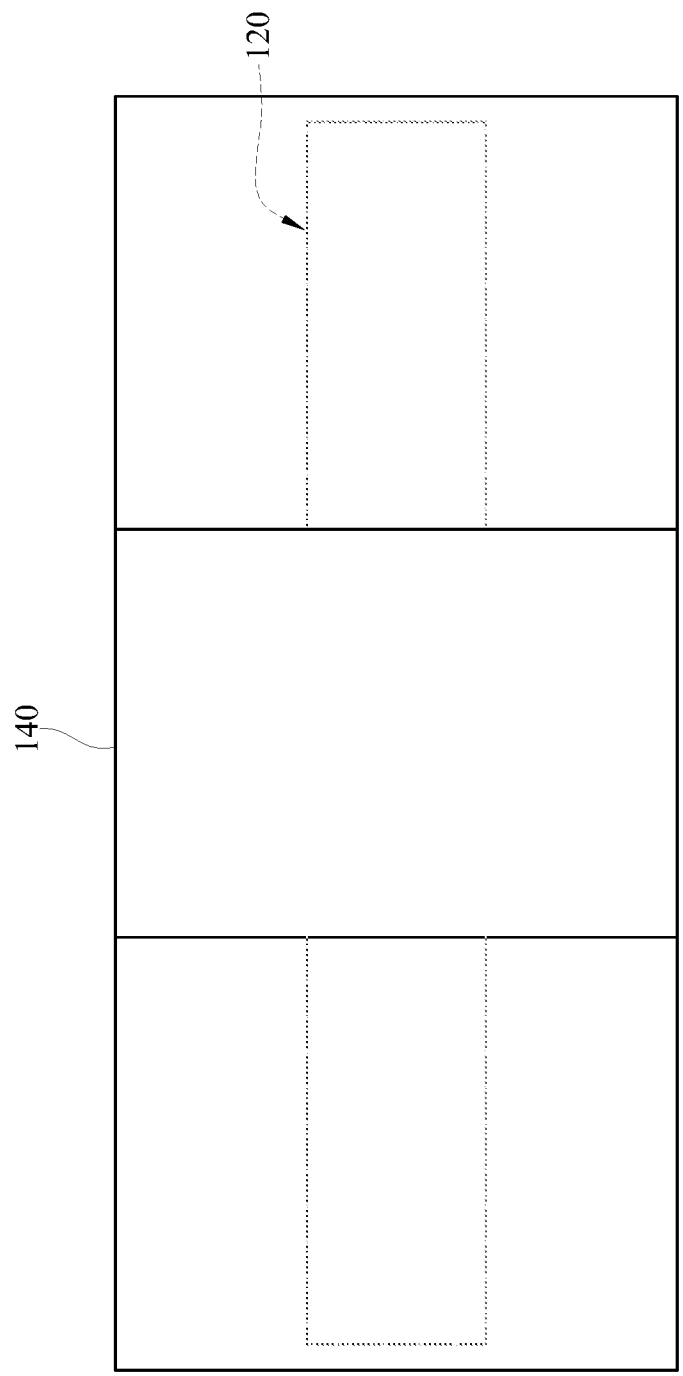
Figure 1D:
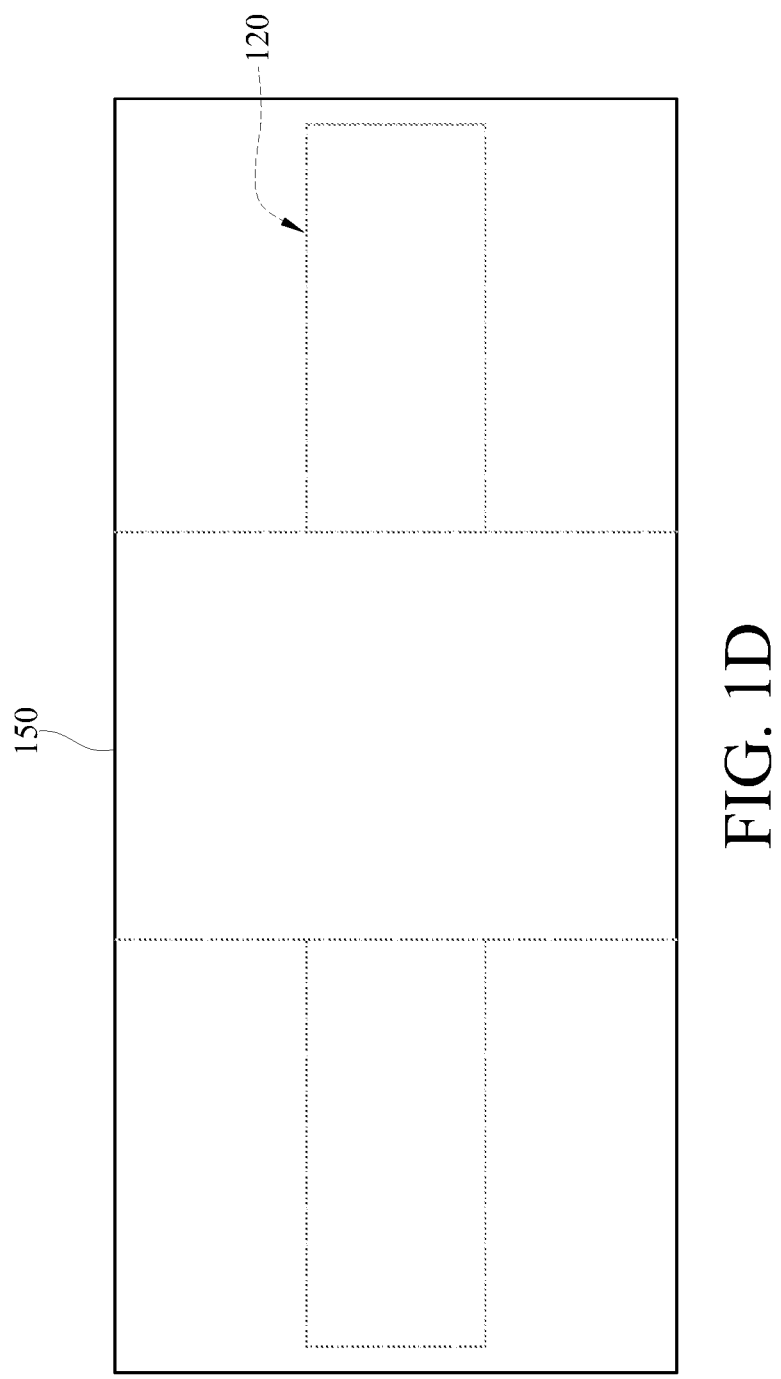
Figure 1E:
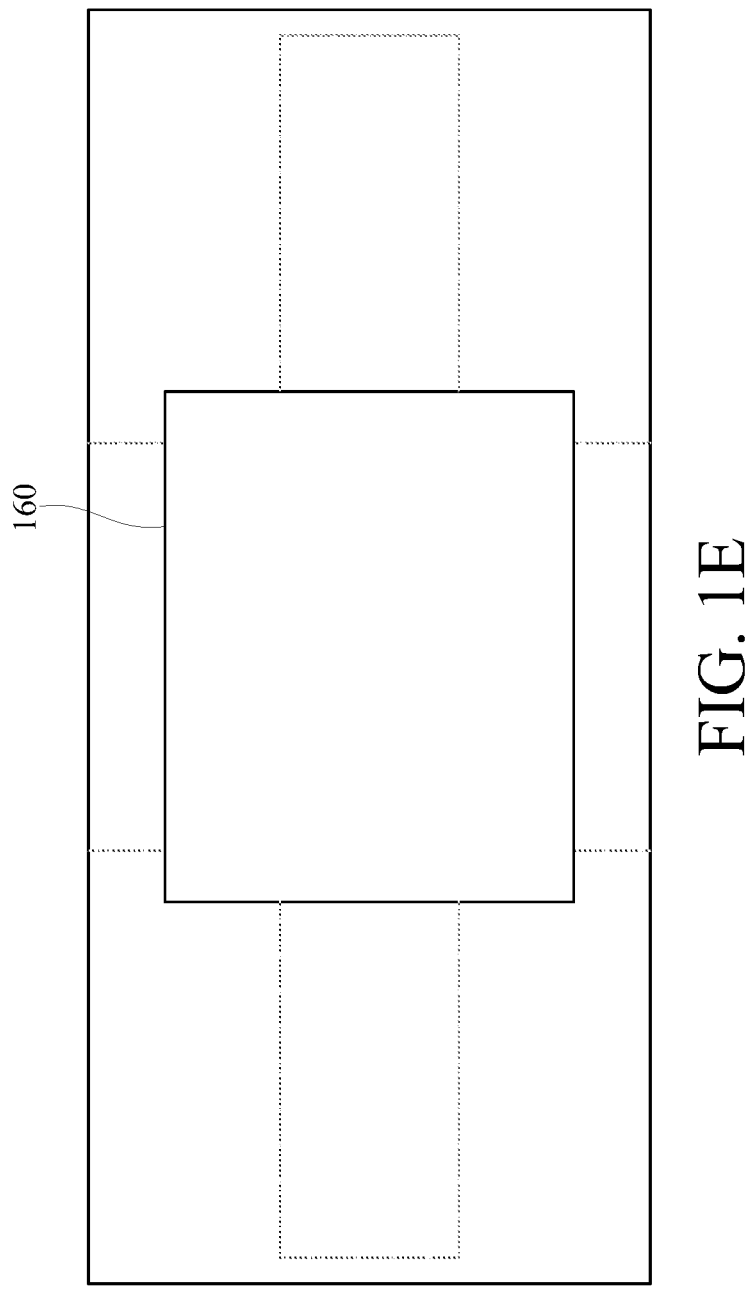
Figure 1F:
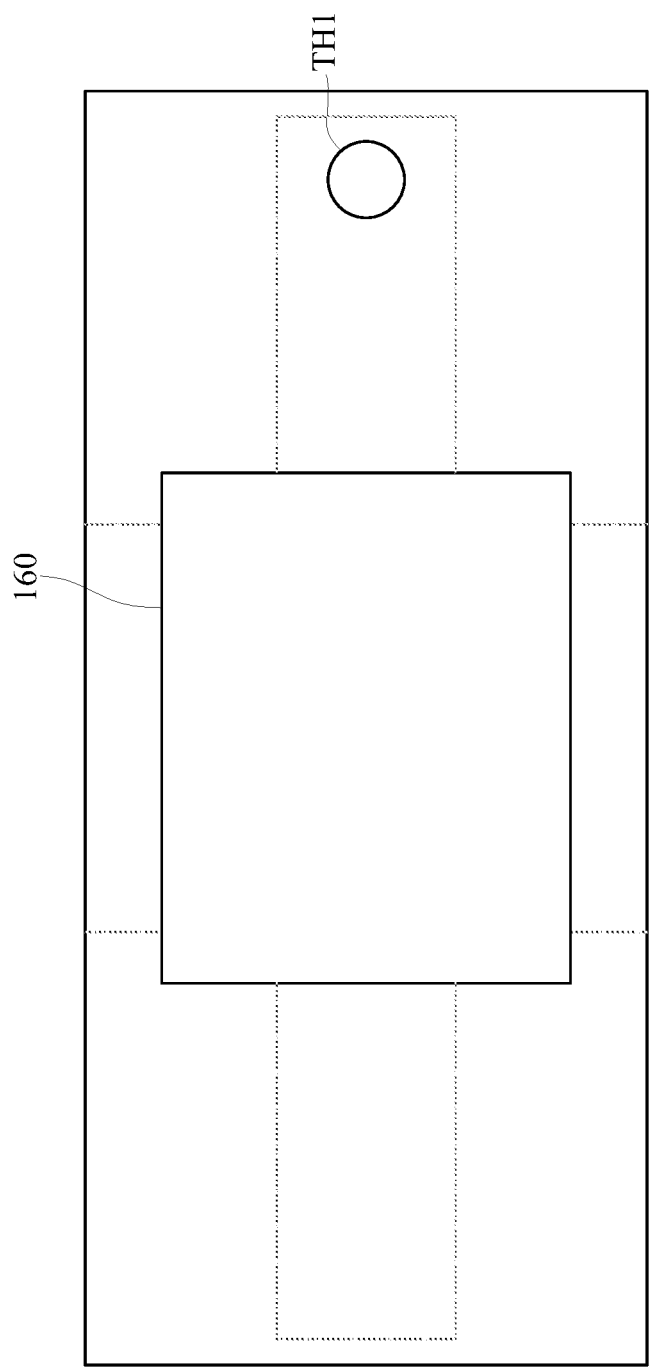
Figure 1G:
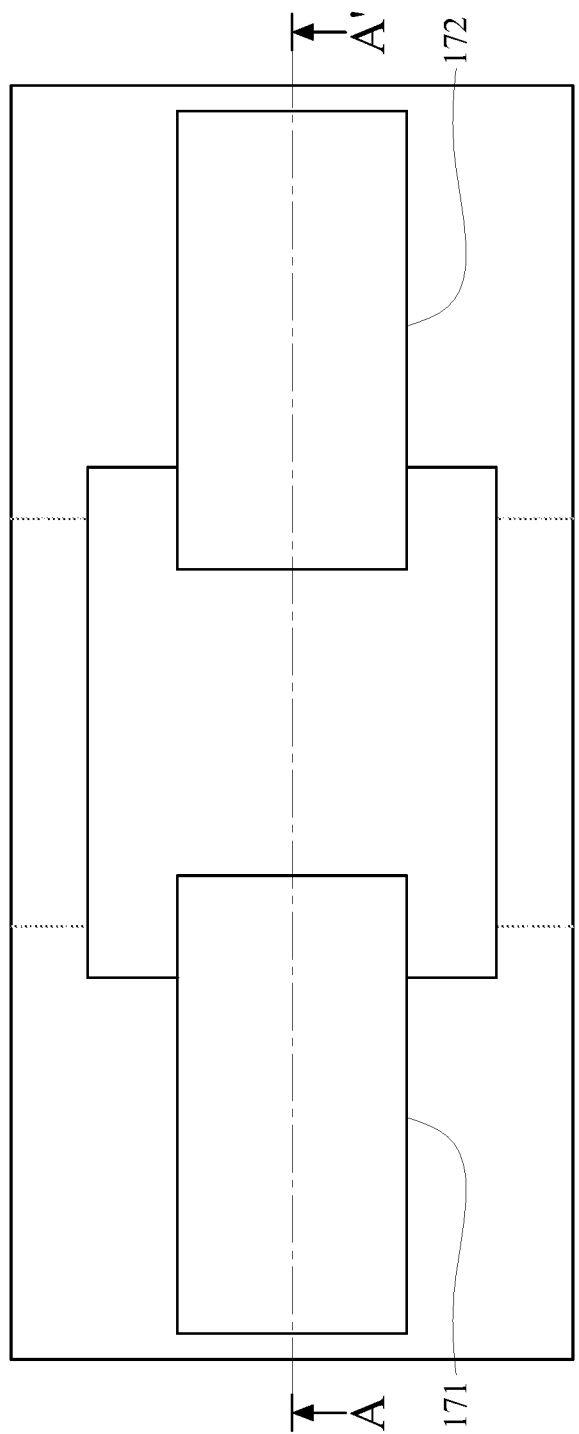
Figure 2:
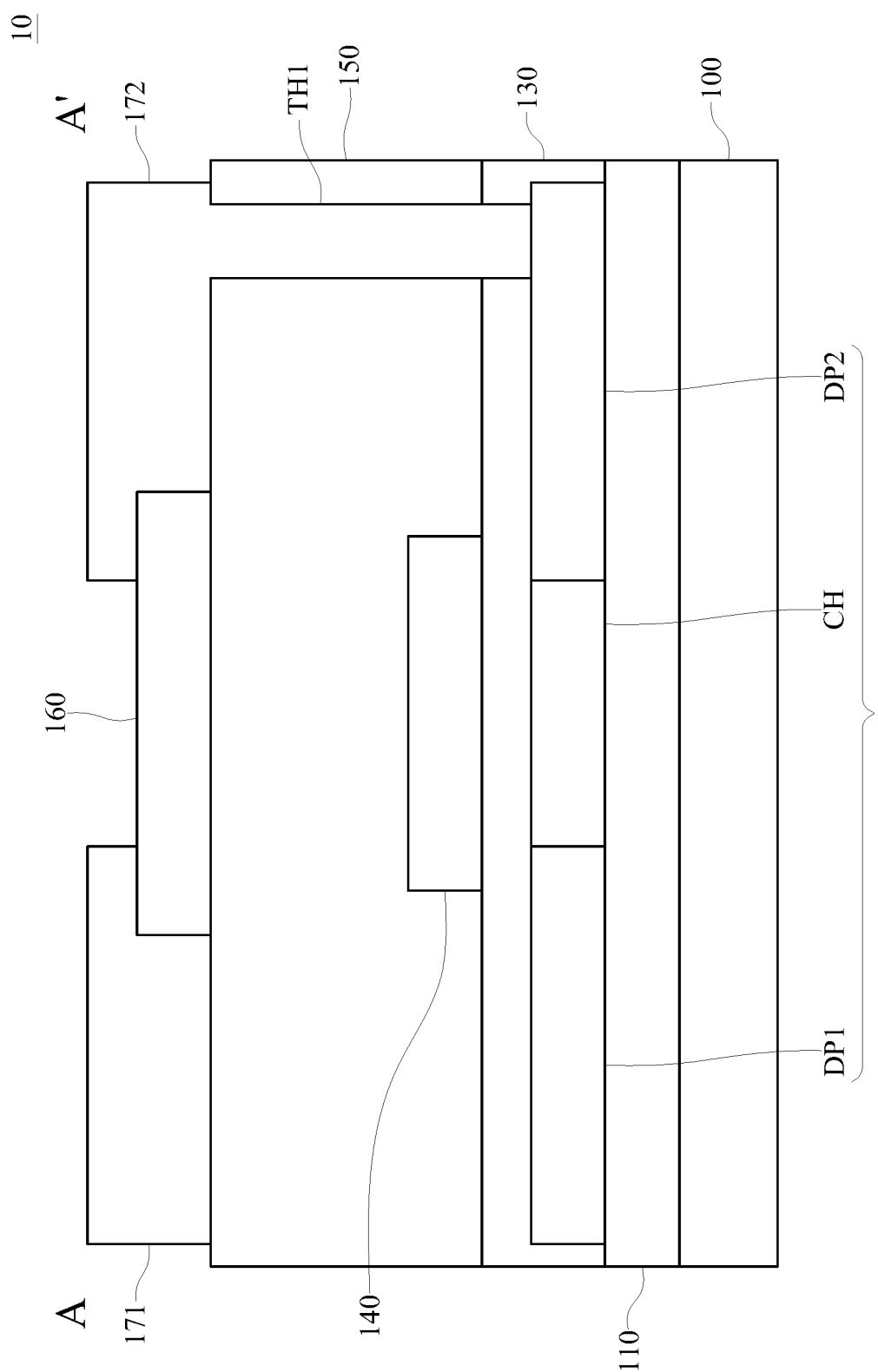
FIG. 2 is a cross-sectional view taken along a cross-sectional line A-A' of FIG. 1G.

FIG. 1A to FIG. 1G are top views of a manufacturing process of an active device according to an embodiment of the present invention. FIG. 2 is a cross-sectional view taken along a cross-sectional line A-A' of FIG. 1G. The following sequentially describes a manufacturing process of a pixel structure of the present embodiment.

Referring to FIG. 1A to FIG. 1G and FIG. 2, first, a substrate 100 is provided (referring to FIG. 2). The material of the substrate 100 may be glass, quartz, organic polymer, or other suitable materials. Second, a buffer layer 110 is selectively formed on the substrate 100 (referring to FIG. 2). The material of the buffer layer 110 may be silicon nitride or other suitable materials. Third, a poly-silicon semiconductor layer 120 is formed on the buffer layer 110 (referring to FIG. 1A). The poly-silicon semiconductor layer 120 includes a first doped region DP1, a second doped region DP2, and a channel region CH. In this embodiment, a method for manufacturing the poly-silicon semiconductor layer 120 is masking, by using a mask (not shown), a part of the poly-silicon semiconductor layer 120 to form the channel region CH, and doping two ends of the poly-silicon semiconductor layer 120 that are not masked to form the first doped region DP1 and the second doped region DP2.

However, the present embodiment is not limited thereto, and other conventional poly-silicon semiconductor layer manufacturing methods may be used to form the first doped region DP1, the channel region CH, and the second doped region DP2 of this embodiment. In this embodiment, doping types of the first doped region DP1 and the second doped region DP2 may be P-type doping, but the present embodiment is not limited thereto. In this embodiment, the channel region CH is located between the first doped region DP1 and the second doped region DP2, but the present embodiment is not limited thereto. Referring to FIG. 1B again, fourth, a first insulating layer 130 is formed above the poly-silicon semiconductor layer 120, and the first insulating layer 130 is a gate electrode insulating layer, for example. The material of the first insulating layer 130 may be inorganic insulating material (e.g. silicon oxide, silicon nitride, silicon oxynitride, or other suitable materials, or a stacked layer of at least two of the foregoing materials), organic insulating material, other suitable materials, or a combination thereof. Fifth, as shown in FIG. 1C, a metal layer (not shown) is formed on the first insulating layer 130; the metal layer is patterned, so as to form a gate electrode 140 corresponding to the channel region CH; and the gate electrode 140 overlaps the channel region CH along a projection direction (not shown) vertical to the substrate, and the overlapping may be partial or completely overlapping according to actual requirements. The material of the gate electrode 140 may be metal, alloy, other suitable materials, or a combination thereof. Sixth, as shown in FIG. 1D, the second insulating layer 150 is deposited on the gate electrode 140 and the first insulating layer 130. The material of the second insulating layer 150 may be the same as or different from that of the first insulating layer 130. Seventh, as shown in FIG. 1E, an oxide semiconductor layer 160 is formed on the second insulating layer 150 and corresponding to the gate electrode 140; the oxide semiconductor layer 160 overlaps the gate electrode 140 along a projection direction vertical to the substrate 100; and the overlapping may be partial or completely overlapping according to actual requirements. The material of the oxide semiconductor layer may be indium-gallium-zinc oxide (IGZO), zinc oxide (ZnO), tin oxide (SnO), indium-zinc oxide (IZO), gallium-zinc oxide (GZO), zinc-tin oxide (ZTO), indium-tin oxide (ITO), other suitable materials, or a combination thereof. Eighth, as shown in FIG. 1F, a first through hole TH1 is formed in a manner of penetrating through the second insulating layer 150 and the first insulating layer 130, so as to expose the second doped region DP2. Ninth, as shown in FIG. 1G, a first electrode 171 and a second electrode 172 are oppositely formed on the oxide semiconductor layer 160 respectively, where the oxide semiconductor layer 160 is electrically connected to the second electrode 172, and is electrically connected to the second doped region DP2 via the first through hole TH1. In this embodiment, the first electrode 171 may be a source electrode that is electrically connected to a data line (not shown), and the second electrode 172 may be a drain electrode that is electrically connected to a pixel electrode (not shown), but the present embodiment is not limited thereto. In this embodiment, the foregoing active device 10 is disposed in a display region of a display panel (not shown), where the display panel may be, for example, a liquid crystal display panel, an organic light emitting display panel, a plasma display panel, or other suitable display panels.

The active device 10 according to an embodiment of the present invention is formed by using the foregoing process. In the present embodiment, a poly-silicon semiconductor layer and an oxide semiconductor layer are simultaneously disposed along a projection direction vertical to a substrate, and the two types of semiconductor layers share a gate electrode, so as to improve space utilization of the active device. Therefore, the active device 10 of this embodiment is disposed in a display region of a display panel, so as to increase an aperture ratio, and further achieve an effect of a narrow frame. Besides, the active device 10 of this embodiment has advantages of poly-silicon semiconductor active device as well as advantages of oxide semiconductor active device, and has relatively high electron mobility as well as relatively preferred low leakage current and critical voltage.

Figure 3A:
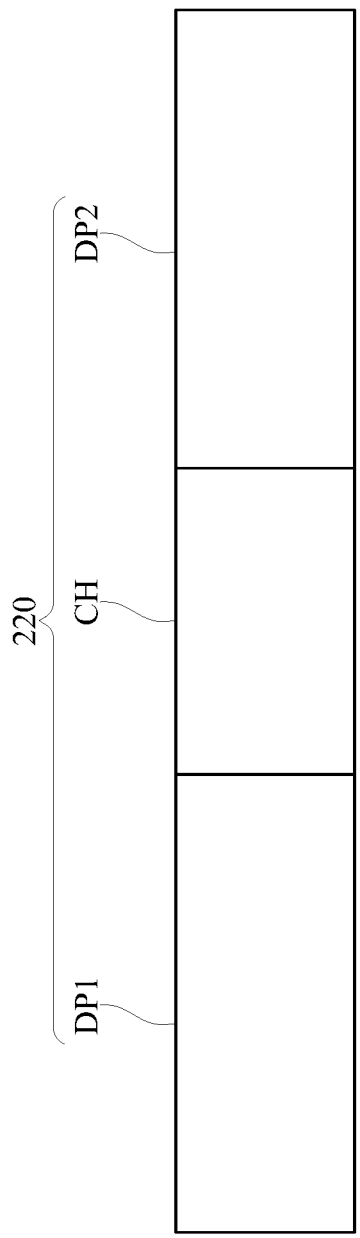
FIG. 3A to FIG. 3G are top views of a manufacturing process of an active device according to a variant embodiment of the present invention.
Figure 3B:
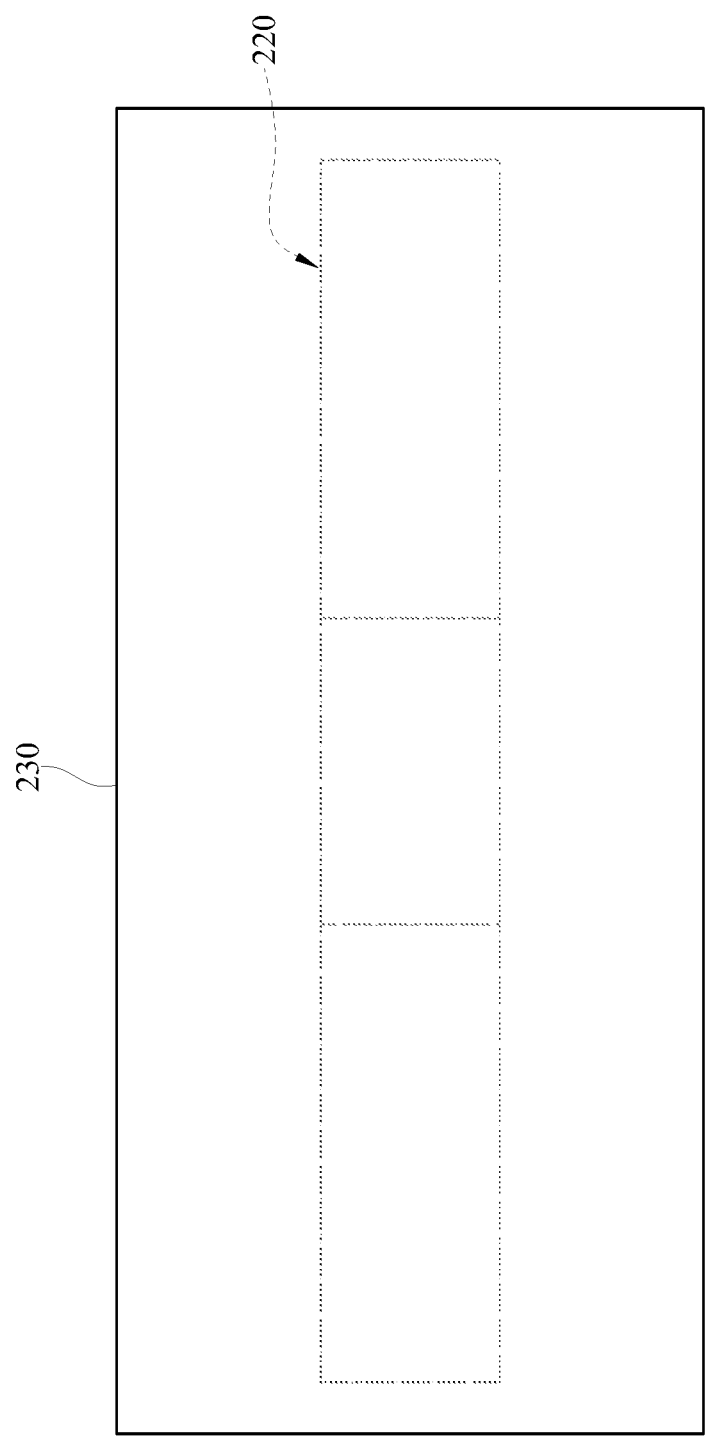
Figure 3C:
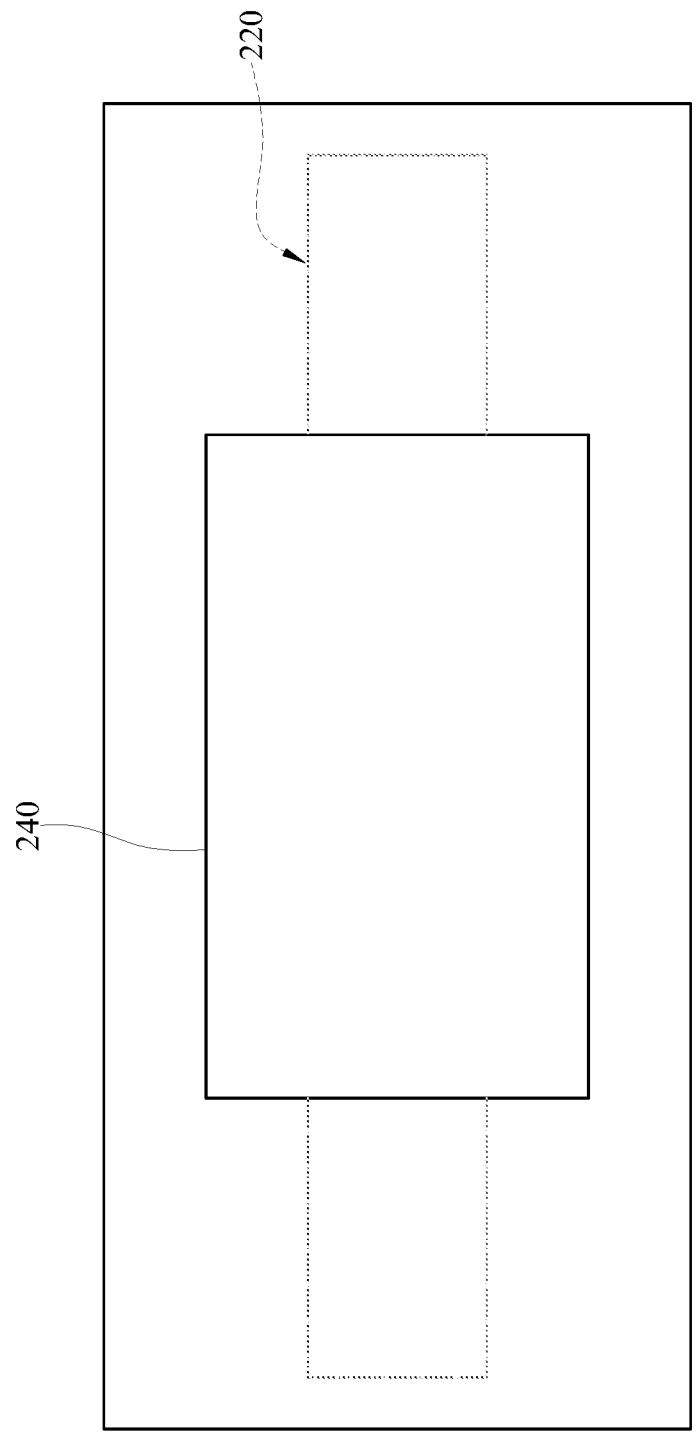
Figure 3D:
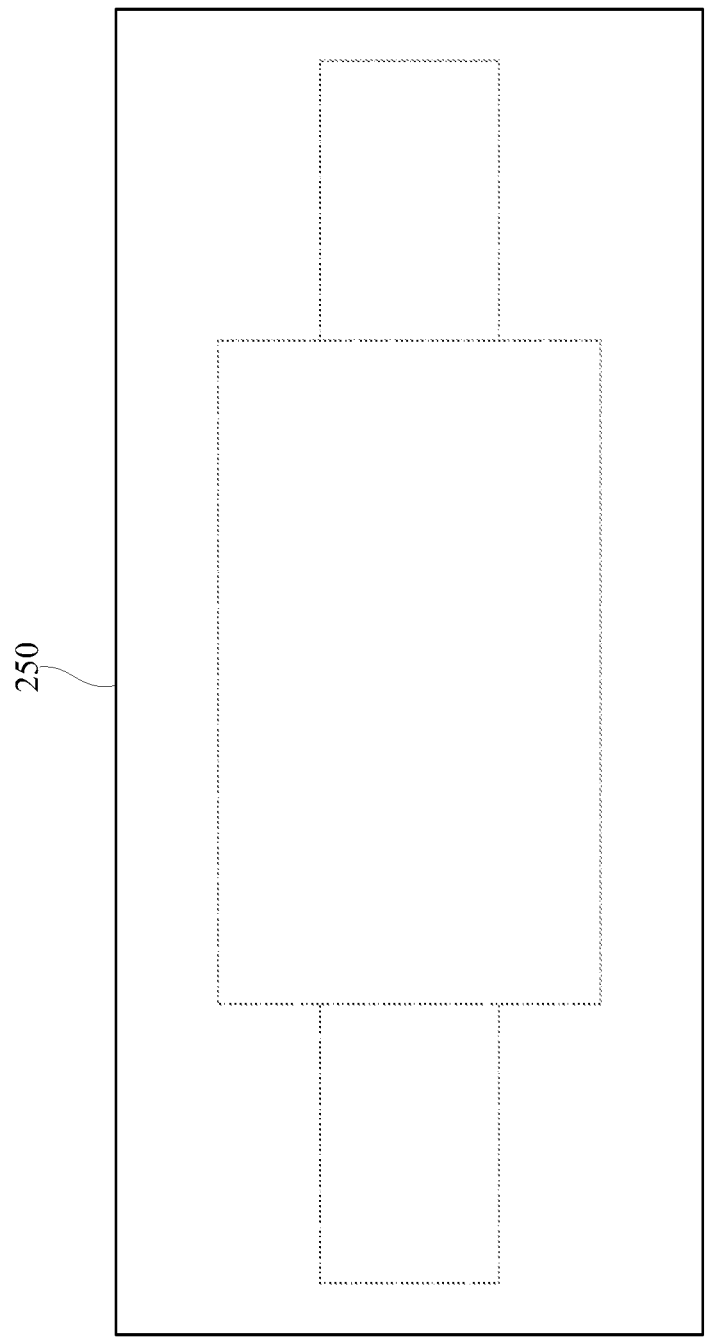
Figure 3E:
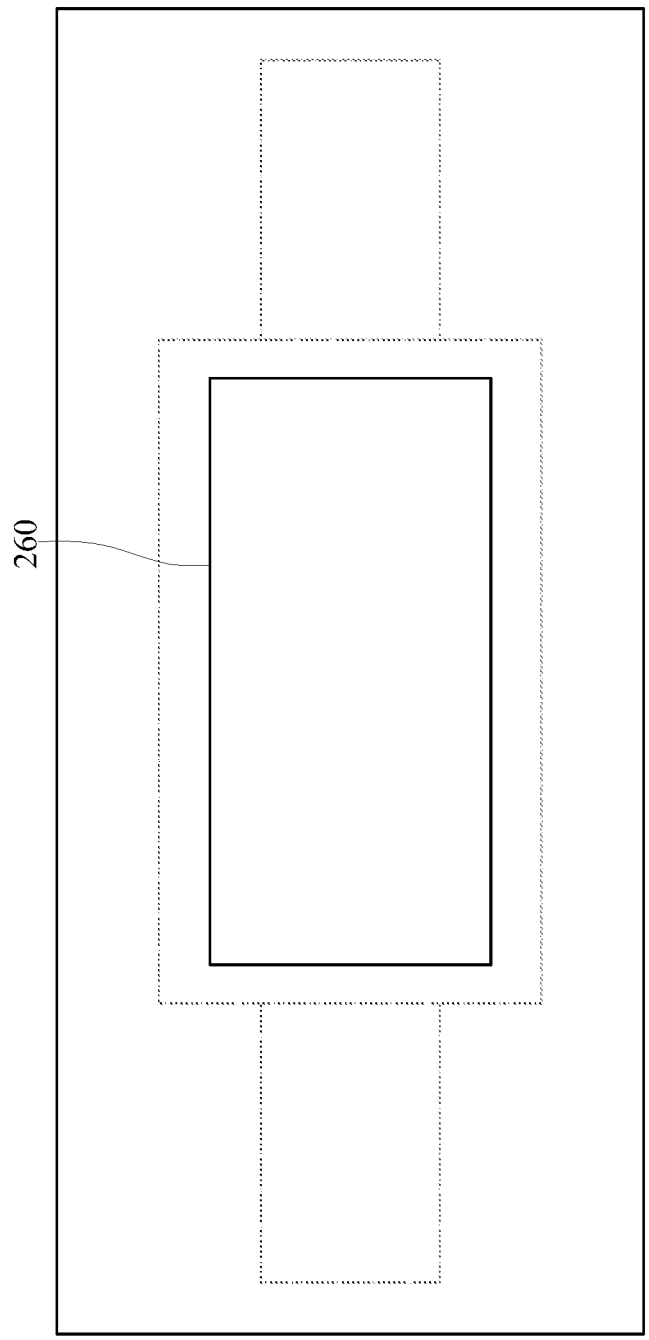
Figure 3F:
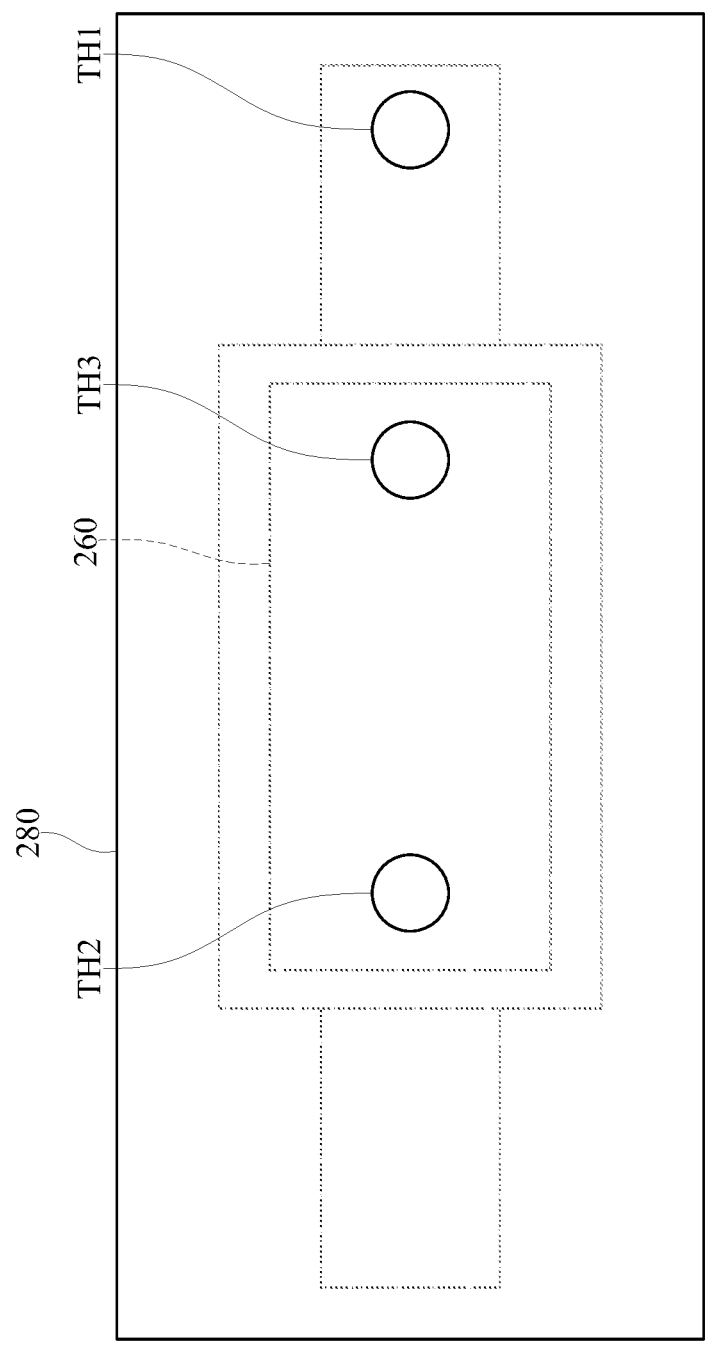
Figure 3G:
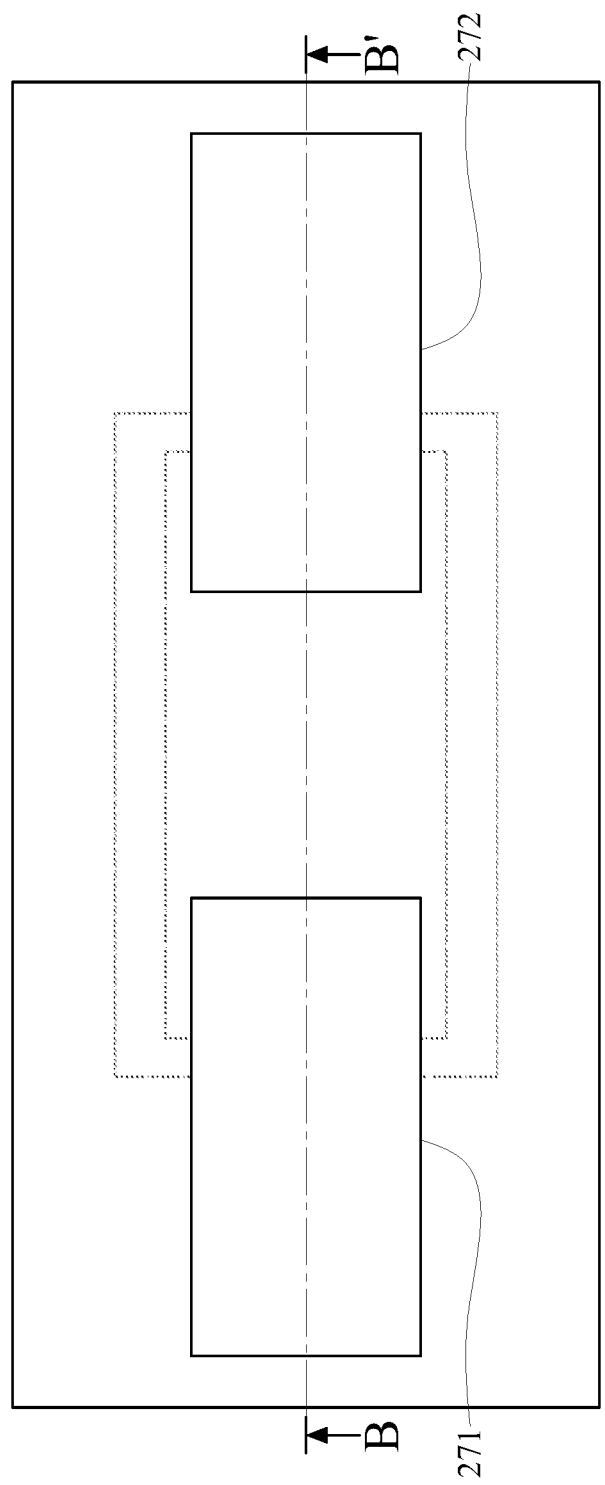
Figure 4:
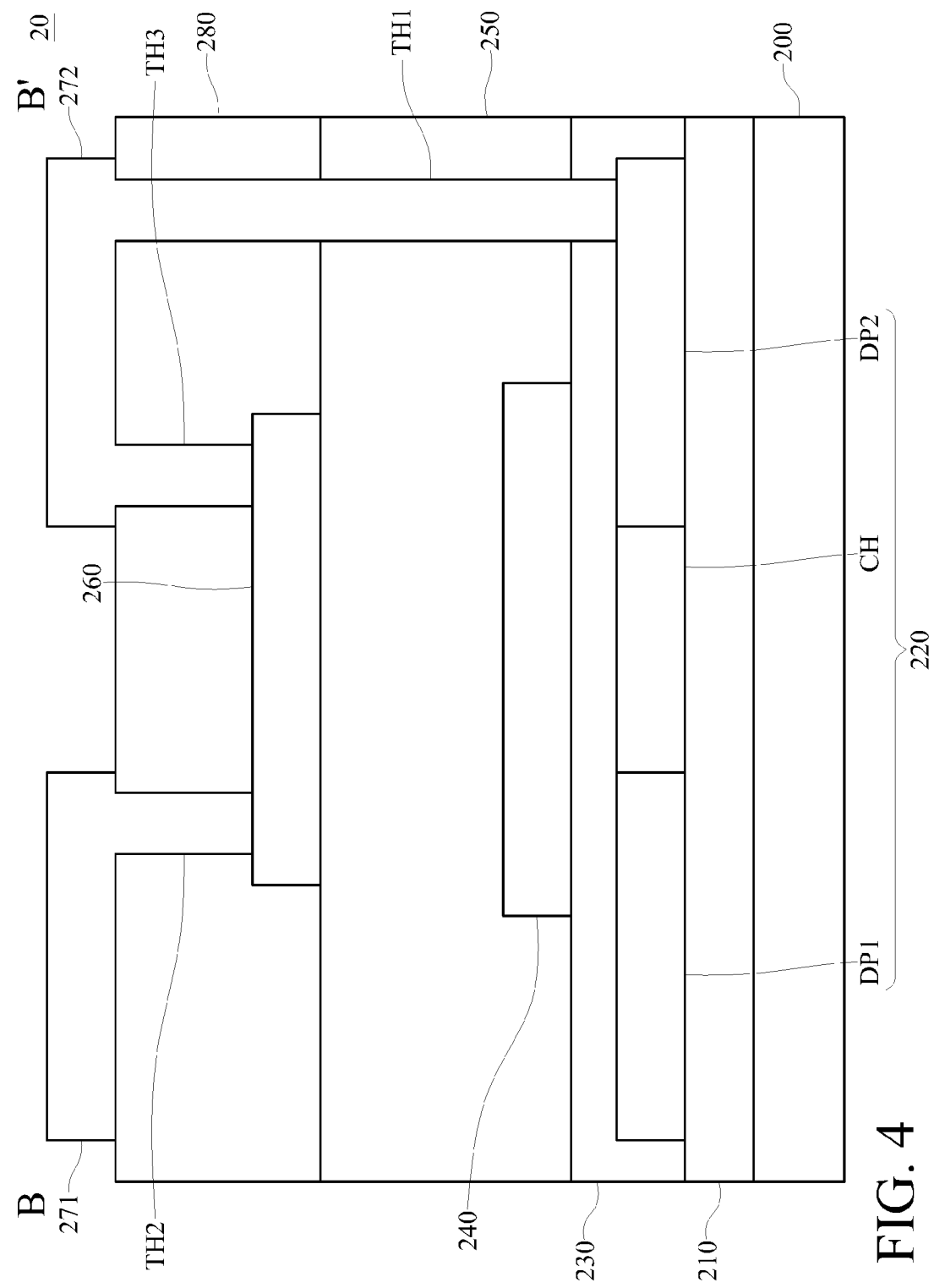
FIG. 4 is a cross-sectional view taken along a cross-sectional line B-B' of FIG. 3G.

FIG. 3A to FIG. 3G and FIG. 4 show an active device according to a variant embodiment of the present invention. Therefore, the following description is mainly conducted with regard to the differences of this embodiment, and the repeated part is not described herein again. Referring to FIG. 3F and FIG. 4, after an oxide semiconductor layer 260 is formed, an etch stop layer 280 is disposed on the oxide semiconductor layer 260 and a second insulating layer 250. The material of the etch stop layer 280 may be inorganic insulating material (e.g. silicon oxide, silicon nitride, silicon oxynitride, or other suitable materials, or a stacked layer of at least two foregoing materials), organic insulating material, other suitable materials, or a combination thereof. In this embodiment, a first through hole TH1 is formed in a manner of penetrating through the etch stop layer 280, the second insulating layer 250, and a first insulating layer 230, so as to expose a second doped region DP2. A second through hole TH2 and a third through hole TH3 are formed, in a penetrating manner, at two ends, respectively corresponding to the oxide semiconductor layer 260, of the etch stop layer 280, so as to respectively expose the oxide semiconductor layer 260. Then, as shown in FIG. 3G and FIG. 4, a first electrode 271 and a second electrode 272 are respectively formed at the two ends, respectively corresponding to the oxide semiconductor layer 260, of the etch stop layer 280. The first electrode 271 is electrically connected to the oxide semiconductor layer 260 via the second through hole TH2. The second electrode 272 is electrically connected to the oxide semiconductor layer 260 via the third through hole TH3. The second electrode 272 is electrically connected to the second doped region DP2 via the first through hole TH1. In this embodiment, the first electrode 271 may be a source electrode that is electrically connected to a data line (not shown), and the second electrode 272 may be a drain electrode that is electrically connected to a pixel electrode (not shown), but the present embodiment is not limited thereto. In this embodiment, the foregoing active device 20 is disposed in a display region of a display panel (not shown), where the display panel may be, for example, a liquid crystal display panel, an organic light emitting display panel, a flexible display panels, a plasma display panel, or other suitable display panels.

The active device 20 according to a variant embodiment of the present invention is formed by using the foregoing process. In the present embodiment, a poly-silicon semiconductor layer and an oxide semiconductor layer are simultaneously disposed along a projection direction vertical to a substrate, and the two types of semiconductor layers share a gate electrode, so as to improve space utilization of the active device. Therefore, the active device 20 of this embodiment is disposed in a display region of a display panel, so as to increase an aperture ratio, and achieve an effect of a narrow frame. Besides, the active device 20 of this embodiment has advantages of poly-silicon semiconductor active device as well as advantages of oxide semiconductor active device, and has relatively high electron mobility as well as relatively preferred low leakage current and critical voltage.

Figure 5A:
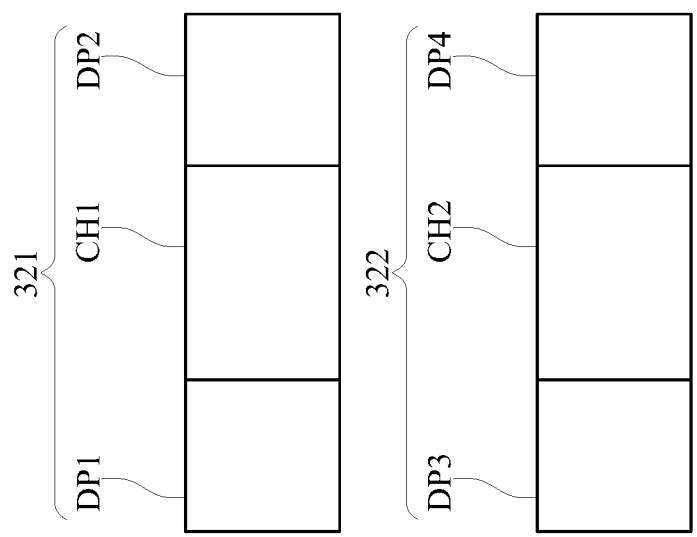
FIG. 5A to FIG. 5F are top views of a manufacturing process of an active device according to another embodiment of the present invention.
Figure 5B:
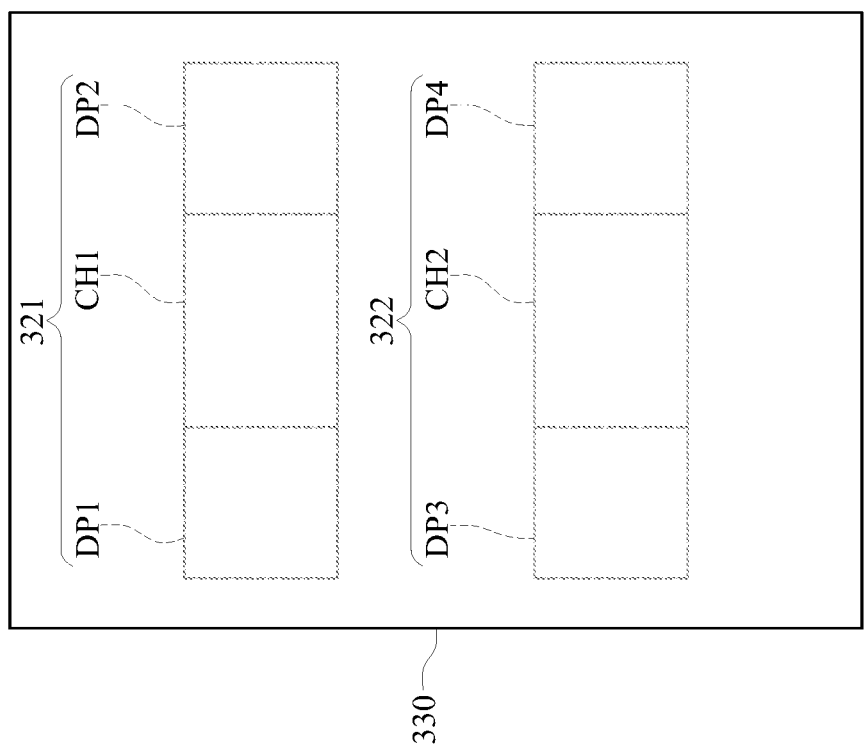
Figure 5C:
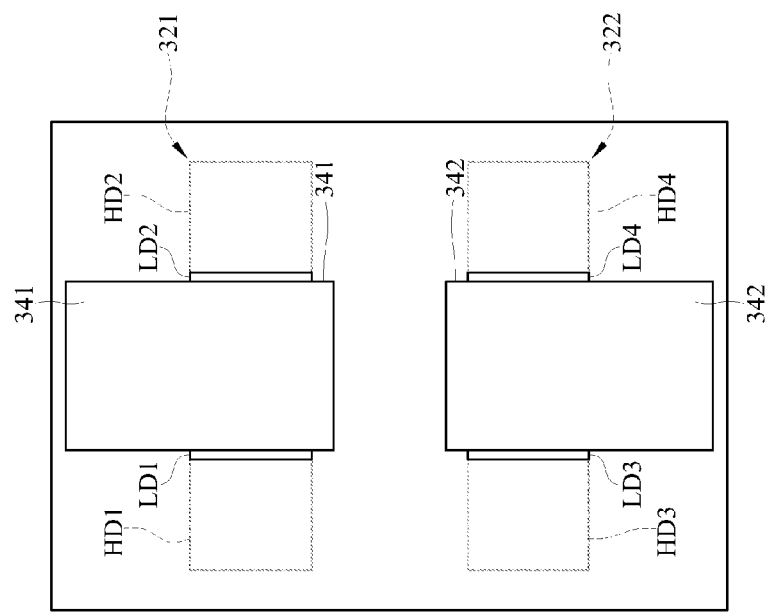
Figure 5D:
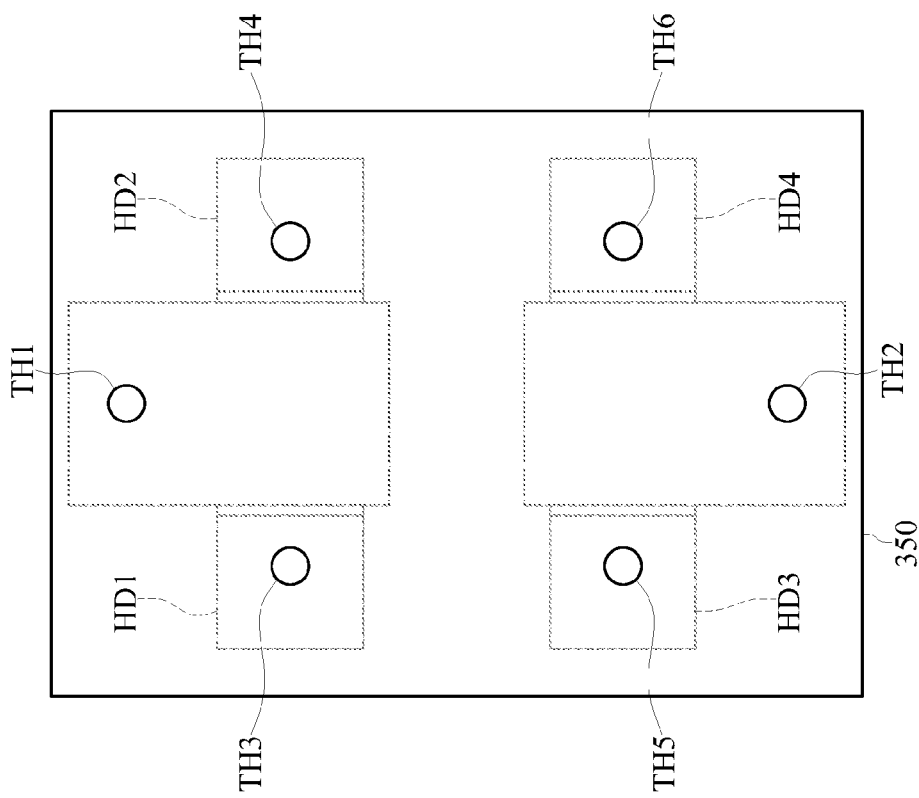
Figure 5E:
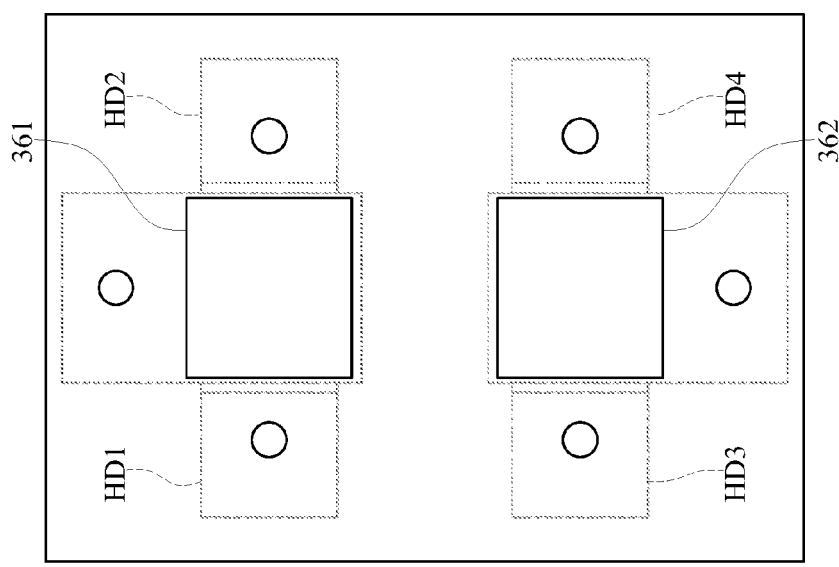
Figure 5F:
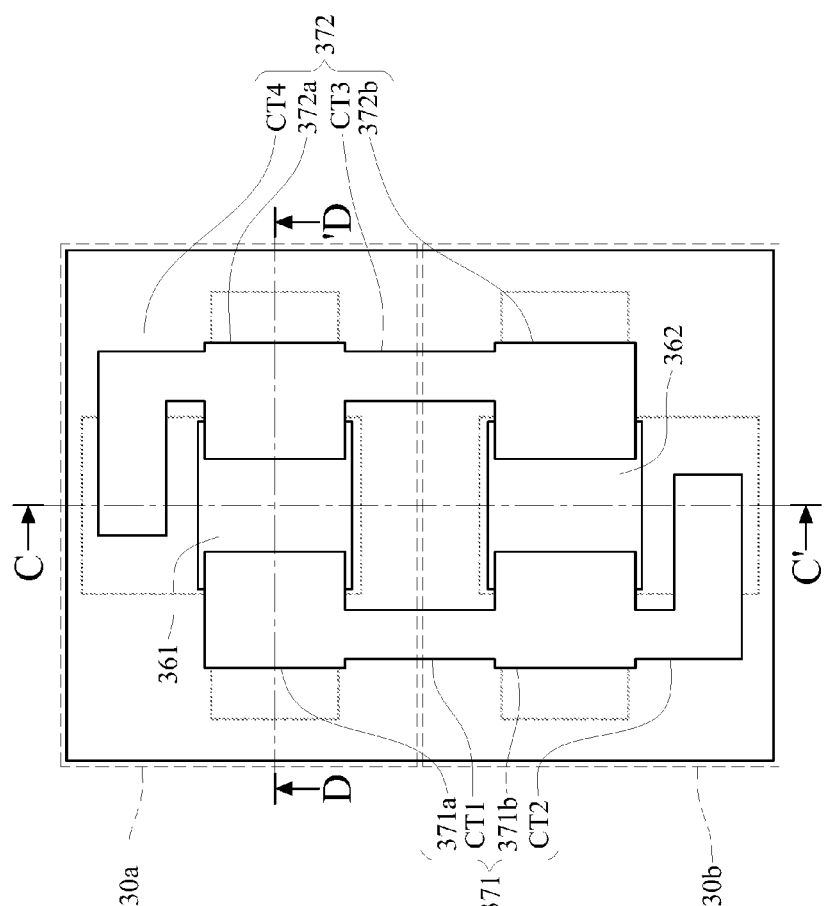
Figure 6:
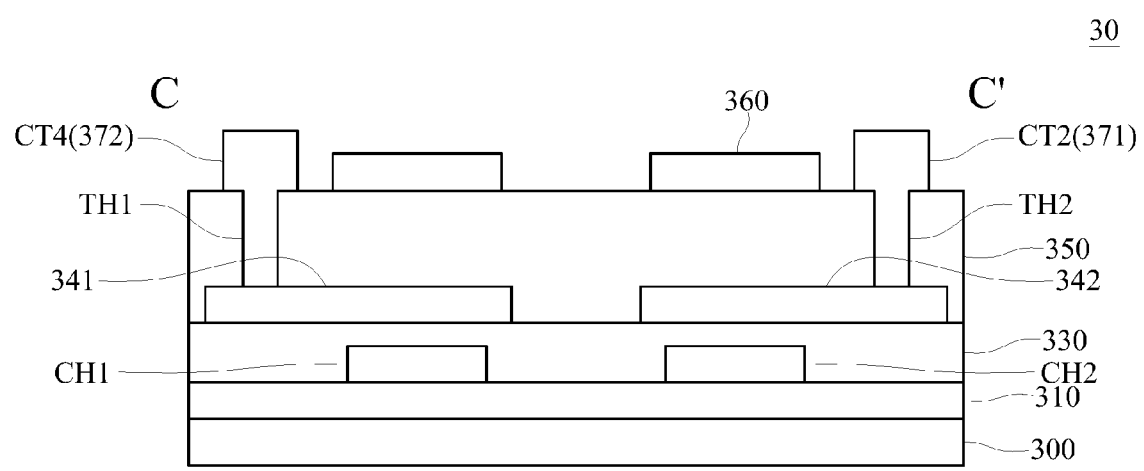
FIG. 6 is a cross-sectional view taken along a cross-sectional line C-C' of FIG. 5F.
Figure 7:
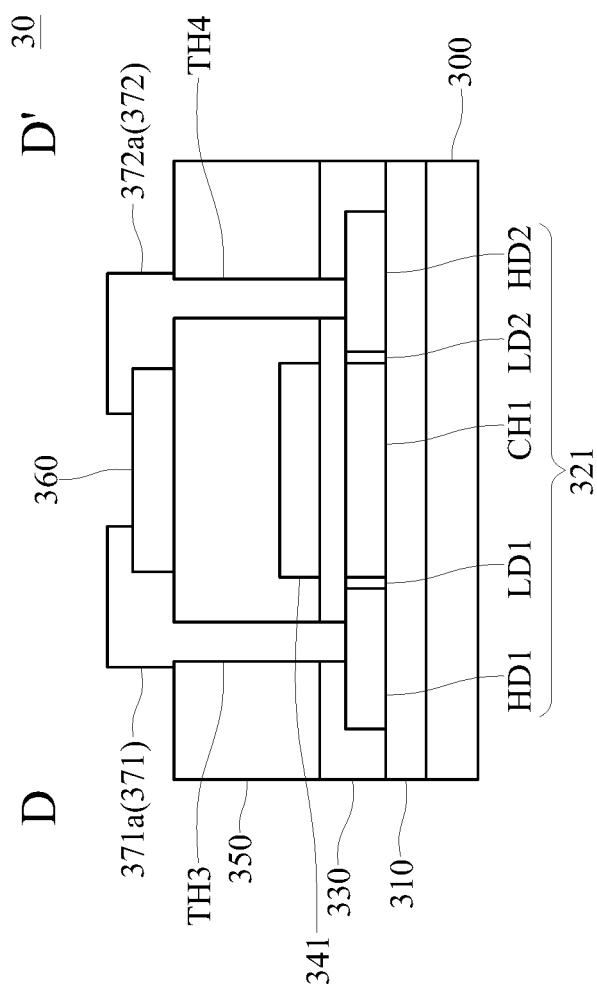
FIG. 7 is a cross-sectional view taken along a cross-sectional line D-D' of FIG. 5F.

FIG. 5A to FIG. 5F, FIG. 6, and FIG. 7 show an active device according to another embodiment of the present invention. Therefore, the following description is mainly conducted with regard to the differences of this embodiment, and the repeated part is not described herein again. Referring to FIG. 5A and FIG. 6, first, a first poly-silicon semiconductor layer 321 and a second poly-silicon semiconductor layer 322 are formed on a buffer layer 310, where the first poly-silicon semiconductor layer 321 has a first doped region DP1, a first channel region CH1, and a second doped region DP2; the second poly-silicon semiconductor layer 322 has a third doped region DP3, a second channel region CH2, and a fourth doped region DP4; the first channel region CH1 is located between the first doped region DP1 and the second doped region DP2; and the second channel region CH2 is located between the third doped region DP3 and the fourth doped region DP4. In this embodiment, doping types of the first doped region DP1, the second doped region DP2, the third doped region DP3, and the fourth doped region DP4 may be N-type doping, but the present invention is not limited thereto. Second, as shown in FIG. 5B, a first insulating layer 330 is formed on the first poly-silicon semiconductor layer 321 and the second poly-silicon semiconductor layer 322. Third, a metal layer (not marked) is formed on the first insulating layer 330, and as shown in FIG. 5C, then the metal layer is patterned, so as to form a first gate electrode 341 and a second gate electrode 342 corresponding to the first channel region CH1 and the second channel region CH2. The first gate electrode 341 and the second gate electrode 342 may partially overlap the first channel region CH1 and the second channel region CH2 respectively along a projection direction vertical to a substrate. Fourth, a first lightly doped region LD1, a second lightly doped region LD2, a third lightly doped region LD3, a fourth lightly doped region LD4, a first heavily doped region HD1, a second heavily doped region HD2, a third heavily doped region HD3 and a fourth heavily doped region HD4 are formed. The first lightly doped region LD1 is located between the first heavily doped region HD1 and the first channel region CH1; the second lightly doped region LD2 is located between the second heavily doped region HD2 and the first channel region CH1; the third lightly doped region LD3 is located between the third heavily doped region HD3 and the second channel region CH2; and the fourth lightly doped region LD4 is located between the fourth heavily doped region HD4 and the second channel region CH2. In this embodiment, doping types of the first heavily doped region HD1, the second heavily doped region HD2, the third heavily doped region HD3, and the fourth heavily doped region HD4 may be the same as or different from doping types of the first lightly doped region LD1, the second lightly doped region LD2, the third lightly doped region LD3, and the fourth lightly doped region LD4, and doping concentrations of the lightly doped regions are less than that of the heavily doped regions. Fifth, as shown in FIG. 5D, a second insulating layer 350 is formed on the first gate electrode 341, the second gate electrode 342, and the first insulating layer 330. Sixth, a first through hole TH1 and a second through hole TH2 are respectively formed in the second insulating layer 350, so as to expose the first gate electrode 341 and the second gate electrode 342 respectively, and respectively penetrate through the first insulating layer 330 and the second insulating layer 350 to form a third through hole TH3, a fourth through hole TH4, a fifth through hole TH5, and a sixth through hole TH6, so as to expose the first heavily doped region HD1, the second heavily doped region HD2, the third heavily doped region HD3, and the fourth heavily doped region HD4 respectively. Seventh, as shown in FIG. 5E, a first oxide semiconductor layer 361 and a second oxide semiconductor layer 362 are disposed on the second insulating layer 350 and respectively corresponding to the first gate electrode 341 and the second gate electrode 342. In this embodiment, the first oxide semiconductor layer 361 and the second oxide semiconductor layer 362 overlap the first gate electrode 341 and the second gate electrode 342 along the projection direction vertical to the substrate, but the present embodiment is not limited thereto. Eighth, as shown in FIG. 5F, a first electrode 371 and a second electrode 372 are respectively disposed at two opposite sides of the first oxide semiconductor layer 361 and the second oxide semiconductor layer 362. The first electrode 371 includes a first electrode portion 371a, a second electrode portion 371b, a first connection portion CT1, and a second connection portion CT2, and the second electrode 372 includes a third electrode portion 372a, a fourth electrode portion 372b, a third connection portion CT3, and a fourth connection portion CT4. In this embodiment, the first electrode portion 371a and the third electrode portion 372a are respectively disposed at two opposite sides of the first oxide semiconductor layer 361 and partially overlap the first oxide semiconductor layer 361, and the second electrode portion 371b and the fourth electrode portion 372b are respectively disposed at two opposite sides of the second oxide semiconductor layer 362 and partially overlap the second oxide semiconductor layer 362. Ninth, the first electrode portion 371a and the second electrode portion 371b are electrically connected to each other via the first connection portion CT1, and the third electrode portion 372a and the fourth electrode portion 372b are electrically connected to each other via the third connection portion CT3. The first electrode portion 371a and the second electrode portion 371b are electrically connected to the first heavily doped region HD1 and the third heavily doped region HD3 respectively via the third through hole TH3 and the fifth through hole TH5, and the third electrode portion 372a and the fourth electrode portion 372b are electrically connected to the second heavily doped region HD2 and the fourth heavily doped region HD4 respectively via the fourth through hole TH4 and the sixth through hole TH6. Tenth, the second electrode portion 371b is electrically connected to the second gate electrode 342 via the second connection portion CT2, and the third electrode portion 372a is electrically connected to the first gate electrode 341 via the fourth connection portion CT4. The second connection portion CT2 is electrically connected to the second gate electrode 342 via the second through hole TH2, and the fourth connection portion CT4 is electrically connected to the first gate electrode 341 via the first through hole TH1. Eleventh, referring to FIG. 5F, the active device 30 includes a first element 30a and a second element 30b, where the first element 30a includes the first electrode portion 371a, the third electrode portion 372a, the first oxide semiconductor layer 361, the first gate electrode 341, and the first poly-silicon semiconductor layer 321, and the second element 30b includes the second electrode portion 371b, the fourth electrode portion 372b, the second oxide semiconductor layer 362, the second gate electrode 342, and the second poly-silicon semiconductor layer 322. In this embodiment, the foregoing active device 30 is disposed in a peripheral area of a display panel (not shown), where the display panel may be, for example, a liquid crystal display panel, an organic light emitting display panel, a plasma display panel, or other suitable display panels.

Figure 8:
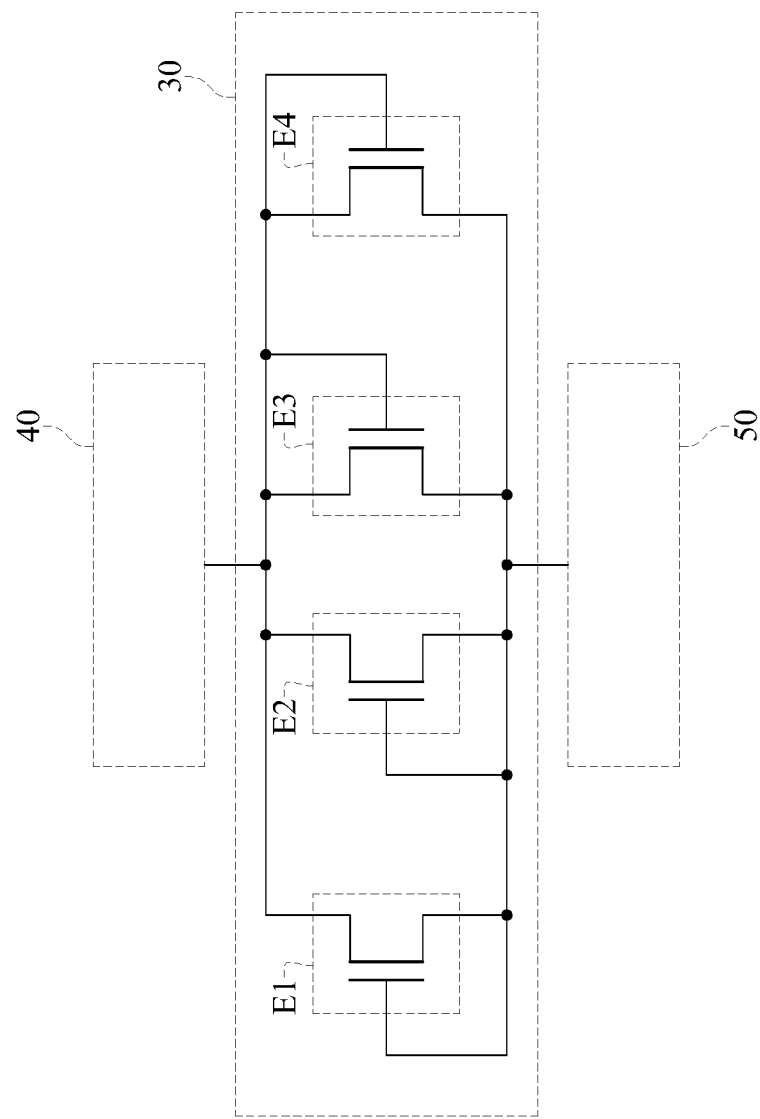
FIG. 8 is a schematic diagram of circuit design according to FIG. 5F.

Referring to FIG. 8, which is a schematic diagram of circuit design according to FIG. 5F. Moreover, is can be known by comparing FIG. 5F with FIG. 8 that the first element 30a includes a first oxide semiconductor element E1 and a first poly-silicon semiconductor element E2, and the second element 30b includes a second oxide semiconductor element E3 and a second poly-silicon semiconductor element E4. The first oxide semiconductor element E1 and the first poly-silicon semiconductor element E2 are connected in parallel, and the second oxide semiconductor element E3 and the second poly-silicon semiconductor element E4 are connected in parallel. Subsequently, the first element 30a and the second element 30b are connected in series to form the active device 30 with an electrostatic discharge protection ring. In this embodiment, two end points of the active device 30 are electrically connected to peripheral lines 40, 50 respectively. The peripheral lines 40, 50 include lines such as scan lines, data lines, and common electrode lines, but the present embodiment is not limited thereto. In this embodiment, an electrostatic discharge protection ring formed by connecting multiple active devices 30 (not shown) in series is further included, and a first active device and a last active device connected in series are electrically connected to the peripheral lines 40, 50 respectively, but the present embodiment is not limited thereto.

The active device 30 according to another embodiment of the present invention is completed by using the foregoing process. In addition to the advantages of the foregoing embodiments, in the present invention, the first element 30a and the second element 30b are electrically connected in series, so as to form an active device 30 with an electrostatic discharge protection ring. Therefore, the active device 30 of this embodiment disposed in the peripheral area of a display panel may function as an electrostatic discharge protection element, so as to prevent circuit design of the peripheral area from electrostatic damage.

To sum up, in an embodiment and another embodiment of the present invention, a poly-silicon semiconductor layer and an oxide semiconductor layer are simultaneously disposed along a vertical projection direction, and the two types of semiconductor layers share a gate electrode, so as to improve space utilization of the active device. Therefore, the active device of the embodiment is disposed in a display region of a display panel, so as to increase an aperture ratio, and further achieve an effect of a narrow frame. Besides, the active device of the embodiment has advantages of poly-silicon semiconductor active device as well as advantages of oxide semiconductor active device, and has relatively high electron mobility as well as relatively preferred low leakage current and critical voltage. Besides the aforementioned advantages, in the embodiment, elements are electrically connected in series to form an active device with electrostatic discharge protection. Therefore, the active device of the embodiment disposed in the peripheral area of a display panel may function as an electrostatic discharge protection element, so as to prevent circuit design of the peripheral area from electrostatic damage.

Although multiple implementation manners are used to describe the present invention as above, the multiple implementation manners are not intended to limit the present invention. A person skilled in the art can make various variations and modifications without departing from the spirit and scope of the present invention. Therefore, the protection scope of the present invention is construed as defined by the appended claims.

What is claimed is:

1. An active device, disposed on a substrate, wherein the active device comprises:
   a poly-silicon semiconductor layer, disposed on the substrate, wherein the poly-silicon semiconductor layer has a first doped region, a channel region, and a second doped region, and the channel region is located between the first doped region and the second doped region;
   a first insulating layer, covering the poly-silicon semiconductor layer and the substrate;
   a gate electrode, disposed on the first insulating layer and corresponding to the channel region;
   a second insulating layer, covering the gate electrode and the first insulating layer, wherein the first insulating layer and the second insulating layer have a first through hole;
   an oxide semiconductor layer, disposed on the second insulating layer and corresponding to the gate electrode; and
   a first electrode and a second electrode, oppositely disposed on the oxide semiconductor layer respectively, wherein the oxide semiconductor layer is electrically connected to the second electrode, and is electrically connected to the second doped region via the first through hole.

2. The active device according to claim 1, wherein the first electrode is in partial contact with one end of the oxide semiconductor layer, and the second electrode is in partial contact with the other end of the oxide semiconductor layer.

3. The active device according to claim 1, further comprising: an etch stop layer, disposed on the second insulating layer and the oxide semiconductor layer, and between the first electrode and the second electrode.

4. The active device according to claim 3, wherein the first through hole further extends to be disposed in the etch stop layer.

5. The active device according to claim 3, wherein the etch stop layer further comprises a second through hole and a third through hole; the first electrode is electrically connected to the oxide semiconductor layer via the second through hole; and the second electrode is electrically connected to the oxide semiconductor layer via the third through hole.

6. An active device, disposed on a substrate, wherein the active device comprises:
   a first poly-silicon semiconductor layer and a second poly-silicon semiconductor layer, disposed on the substrate, wherein the first poly-silicon semiconductor layer has a first channel region and the second poly-silicon semiconductor layer has a second channel region;
   a first insulating layer, covering the first poly-silicon semiconductor layer, the second poly-silicon semiconductor layer, and the substrate;
   a first gate electrode and a second gate electrode, disposed on the first insulating layer and respectively corresponding to the first channel region and the second channel region;
   a second insulating layer, covering the first gate electrode, the second gate electrode, and the first insulating layer, wherein the second insulating layer has a first through hole and a second through hole, and the first through hole and the second through hole are disposed respectively corresponding to the first gate electrode and the second gate electrode;
   a first oxide semiconductor layer and a second oxide semiconductor layer, disposed on the second insulating layer and respectively corresponding to the first gate electrode and the second gate electrode; and
   a first electrode and a second electrode, oppositely disposed on the first oxide semiconductor layer and the second oxide semiconductor layer respectively, wherein the first electrode is electrically connected to the second gate electrode, the first oxide semiconductor layer, and the second oxide semiconductor layer; the second electrode is electrically connected to the first gate electrode, the first oxide semiconductor layer, and the second oxide semiconductor layer; the first electrode comprises a first electrode portion, a second electrode portion, a first connection portion, and a second connection portion; and the second electrode portion comprises a third electrode portion, a fourth electrode portion, a third connection portion, and a fourth connection portion.

7. The active device according to claim 6, wherein the first electrode portion and the third electrode portion are oppositely disposed at two sides of the first oxide semiconductor layer respectively and are in partial contact with each other, and the second electrode portion and the fourth electrode portion are oppositely disposed at two sides of the second oxide semiconductor layer respectively and are in partial contact with each other.

8. The active device according to claim 6, wherein the first electrode portion and the second electrode portion are electrically connected to each other via the first connection portion, and the third electrode portion and the fourth electrode portion are electrically connected to each other via the third connection portion.

9. The active device according to claim 6, wherein the second electrode portion is electrically connected to the second gate electrode via the second connection portion and the second through hole, and the third electrode portion is electrically connected to the first gate electrode via the fourth connection portion and the first through hole.

10. The active device according to claim 6, wherein the first insulating layer and the second insulating layer further comprise a third through hole, a fourth through hole, a fifth through hole, and a sixth through hole, which are disposed corresponding to a first heavily doped region, a second heavily doped region, a third heavily doped region, and a fourth heavily doped region respectively.

11. The active device according to claim 10, the first electrode portion and the third electrode portion are electrically connected to the first heavily doped region and the second heavily doped region via the third through hole and the fourth through hole respectively, and the second electrode portion and the fourth electrode portion are electrically connected to the third heavily doped region and the fourth heavily doped region via the fifth through hole and the sixth through hole respectively.

12. The active device according to claim 10, wherein the first oxide semiconductor layer further comprises a first lightly doped region and a second lightly doped region; the first lightly doped region is located between the first heavily doped region and the first channel region; and the second lightly doped region is located between the second heavily doped region and the first channel region.

13. The active device according to claim 12, wherein the second oxide semiconductor layer further comprises a third lightly doped region and a fourth lightly doped region; the third lightly doped region is located between the third heavily doped region and the second channel region; and the fourth lightly doped region is located between the fourth heavily doped region and the second channel region.

14. An active device comprising:
   a poly-silicon semiconductor layer, having a first doped region, a channel region and a second doped region;
   a gate electrode disposed over the poly-silicon semiconductor layer;
   at least one insulating layer covering the gate electrode and the poly-silicon semiconductor layer, and having a first through hole;
   an oxide semiconductor layer, disposed on the at least one insulating layer; and
   a first electrode and a second electrode, disposed on the oxide semiconductor layer, wherein the oxide semiconductor layer is electrically connected to the second electrode, and wherein the second electrode is electrically connected to the second doped region via the first through hole.

15. The active device according to claim 14, wherein the at least one insulating layer further has a second through hole and a third through hole, wherein the first electrode is electrically connected to the oxide semiconductor layer via the second through hole, wherein the second electrode is electrically connected to the oxide semiconductor layer via the third through hole, and wherein the first through hole is not overlapped with the second through hole.

16. The active device according to claim 14, wherein the poly-silicon semiconductor layer, the gate electrode and the oxide semiconductor layer are overlapped along a vertical projection direction.

* * * * *